US012800647B2

(12) United States Patent
Kim

(10) Patent No.: US 12,800,647 B2
(45) Date of Patent: Nov. 17, 2026

(54) CARTRIDGE MODULE AND MULTI WAFER BURN-IN TEST DEVICE UTILIZING SAME

(71) Applicant: UNITEST INC, Yongin-si (KR)

(72) Inventor: Dae Kyoung Kim, Yongin-si (KR)

(73) Assignee: UNITEST INC, Yongin-si (KR)

( * ) Notice: Subject to any disclaimer, the term of this patent is extended or adjusted under 35 U.S.C. 154(b) by 77 days.

(21) Appl. No.: 18/774,308

(22) Filed: Jul. 16, 2024

(65) Prior Publication Data

US 2025/0251443 A1 Aug. 7, 2025

(30) Foreign Application Priority Data

Feb. 6, 2024 (KR) ........................ 10-2024-0017876

(51) Int. Cl.
*G01R 31/28* (2006.01)
*G01R 1/04* (2006.01)

(52) U.S. Cl.
CPC ....... *G01R 31/2867* (2013.01); *G01R 1/0491* (2013.01); *G01R 31/2862* (2013.01)

(58) Field of Classification Search
None
See application file for complete search history.

(56) References Cited

U.S. PATENT DOCUMENTS

| | | | |
|---|---|---|---|
| 2008/0231301 A1 | 9/2008 | Suzuki et al. | |
| 2013/0278279 A1 | 10/2013 | Ishii et al. | |
| 2015/0276811 A1 | 10/2015 | Yamada et al. | |
| 2021/0333319 A1* | 10/2021 | Konishi | G01R 31/2867 |
| 2023/0014966 A1 | 1/2023 | Snow et al. | |

FOREIGN PATENT DOCUMENTS

| | | |
|---|---|---|
| CN | 104704623 B | 7/2017 |
| JP | 1031035 A | 2/1998 |
| JP | 2010527515 A | 8/2010 |
| KR | 10-1999-0006406 A | 1/1999 |
| KR | 10-2010-0130540 A | 12/2010 |
| KR | 10-1658272 B1 | 9/2016 |
| KR | 10-2049413 B1 | 11/2019 |
| KR | 10-2021-0009094 A | 1/2021 |
| KR | 10-2384776 B1 | 4/2022 |
| KR | 10-2023-0060900 A | 5/2023 |
| TW | 200905786 A | 2/2009 |
| WO | 2008-144437 A1 | 11/2008 |

* cited by examiner

*Primary Examiner* — Farhana A Hoque
(74) *Attorney, Agent, or Firm* — You & IP, LLC

(57) ABSTRACT

Proposed is a cartridge module that modularizes a probe card and a wafer to maintain positions thereof, and a multi wafer burn-in test device capable of inspecting multiple wafers in one test using the same. The device includes at least two chambers (120), each of which has a test head (121) that electrically connects a probe card and a tester (110) to test a loaded wafer, a cartridge module (200) including a first body (210) provided with the probe card (211), and a second body (220) provided with a wafer chuck (221) on which a wafer (10) is seated, the first body (210) and the second body (220) being detachably assembled with each other, a wafer loading unit (130) for loading the wafer (10) into the second body (220), and a transfer unit (150) configured to transfer and deliver the cartridge module (200).

16 Claims, 13 Drawing Sheets

CARTRIDGE MODULE AND MULTI WAFER BURN-IN TEST DEVICE UTILIZING SAME

CROSS REFERENCE TO RELATED APPLICATION

The present application claims priority to Korean Patent Application No. 10-2024-0017876, filed Feb. 6, 2024, the entire contents of which is incorporated herein for all purposes by this reference.

BACKGROUND OF THE INVENTION

Field of the Invention

The present disclosure relates to a cartridge module that modularizes a probe card and a wafer to maintain positions thereof, and a multi wafer burn-in test device capable of inspecting multiple wafers in one test using the same.

Description of the Related Art

In general, semiconductor devices or components are fabricated by repeatedly performing a series of processes on a wafer. For example, semiconductor devices may be fabricated on a wafer by repeatedly performing processes that include deposition to form a film on a wafer, etching to create patterns with electrical characteristics on the deposited wafer, ion implantation or diffusion to implant or diffuse impurities into the patterns, and cleaning and rinsing to remove impurities from the wafer on which patterns are formed.

The semiconductor devices manufactured through this series of processes may be subjected to a wafer testing process to inspect the electrical properties of the semiconductor devices. The testing process is carried out by means of a probe station containing a probe card with multiple probes and a tester connected to the probe card to provide an electrical signal.

A typical probe station consists of a test chamber, a chuck disposed in the test chamber to support a wafer, a chuck transfer device that drives the chuck, a probe card having a plurality of probes configured to contact semiconductor devices formed on a wafer, and a tester connected to the probe card to perform testing.

In such a conventional probe station, a chuck transfer device transports a chuck on which a wafer is seated to a test chamber, the positions of contact electrodes on the wafer and probes of a probe card are identified by using a vision sensor such as a CCD camera, and on the basis of the identified position information, the chuck transfer device is controlled to bring the contact electrodes of the wafer into contact with the probes to be electrically connected with each other.

Typically, wafer testing is a single probe test that examines only one wafer at a time. The present disclosure is intended to efficiently test a large number of wafers by breaking away from a conventional wafer testing process of the single probe test. To this end, this application discloses a cartridge module and a multi wafer burn-in test device using the same.

DOCUMENTS OF RELATED ART (Patent Document 0001) Korean Patent Application Publication No. 10-2010-0130540 (published Dec. 13, 2010)

SUMMARY OF THE INVENTION

Accordingly, the present disclosure has been made keeping in mind the above problems occurring in the related art, and the present disclosure is intended to provide a cartridge module that modularizes a probe card and a wafer into one for wafer inspection and enables the probe card and the wafer to maintain positions thereof, and a multi wafer burn-in test device using the same.

In order to achieve the above objective, according to an embodiment of the present disclosure, there is provided a multi wafer burn-in test device including: at least two chambers, each of which has a test head that electrically connects a probe card and a tester to test a loaded wafer; a cartridge module comprising a first body provided with the probe card, and a second body provided with a wafer chuck on which a wafer is seated, the first body and the second body being detachably assembled with each other; a wafer loading unit for loading the wafer into the second body and then clamping the first body and the second body; and a transfer unit configured to transfer and deliver the cartridge module between the wafer loading unit and the chambers.

Preferably, each of the chambers may include: a guide rail on which the cartridge module is located; a temperature control device provided below the cartridge module on the guide rail to control temperature; a lifting unit for raising and lowering the temperature control device; and a drive source supply for supplying a drive source to the cartridge module on the guide rail.

Preferably, the device may further include: a cartridge module rack configured to accommodate at least two cartridge modules.

Preferably, the cartridge module may be provided with a magnet holder in the second body corresponding to a guide hole formed through the first body, and may include: a weight ring provided with a magnet chuck that is inserted into the guide hole and is fixed to the magnet holder by magnetic force, and assembled with the second body at a top of the first body; and a clamp provided between the first body and the weight ring to maintain a gap between the first body and the weight ring.

Next, a cartridge module according to an embodiment of the present disclosure is a cartridge module provided with a probe card for inspecting a wafer, allowing the wafer and the probe card to be modularized and transported. The cartridge module includes: a first body provided with a probe card and having a guide hole formed vertically therethrough; a second body provided with a wafer chuck on which a wafer is seated, provided with a magnet holder in correspondence with the guide hole, and is detachably assembled with the first body; a weight ring provided with a magnet chuck that is inserted into the guide hole and is fixed to the magnet holder by magnetic force, and assembled with the second body at a top of the first body; and a clamping member configured to clamp or unclamp the first body and the second body to fix and attach/detach the first body and the second body.

Preferably, the magnet chuck may further include a friction pad provided between a contact surface with the magnet holder.

Preferably, the clamp may include: a shaft with an end fixed to one of the weight ring and the first body; and a pneumatic drive unit fixed to the other one of the weight ring and the first body and fixed to the shaft by a pneumatic signal.

More preferably, the pneumatic drive unit may be a normally closed type.

Preferably, the second body may include a saddle body, as a heat conductor, in contact with the wafer chuck, wherein the saddle body may include: an inner saddle body that is partitioned by an insulation member and is in direct contact with the wafer chuck; and an outer saddle body forming a periphery of the inner saddle body.

More preferably, the inner saddle body may further include a plurality of vertically penetrating heat conductive members with greater thermal conductivity than the saddle body.

Preferably, at least two magnet chucks may be provided at a lower part of the weight ring, and more preferably, at least two clamps may be provided between the first body and the weight ring.

More preferably, at least one clamp may be provided between the magnet chucks that are adjacent to each other.

Preferably, the device may further include: a guide member between the first body and the weight ring to guide an assembly position of the first body and the weight ring.

A multi wafer burn-in test device of the present disclosure can maximize test efficiency by inspecting multiple wafers in one test as the device includes: at least two chambers; a cartridge module including a first body provided with a probe card, and a second body provided with a wafer chuck on which a wafer is seated, the first body and the second body being detachably assembled with each other; a wafer loading unit for loading a wafer into the second body and then clamping the first body and the second body; and a transfer unit configured to transfer and deliver the cartridge module between the wafer loading unit and the chambers.

In addition, a cartridge module of the present disclosure is a cartridge module provided with a probe card for inspecting a wafer, allowing the wafer and the probe card to be modularized and transported. The cartridge module includes: a first body provided with a probe card and having a guide hole formed vertically therethrough; a second body provided with a wafer chuck on which a wafer is seated, provided with a magnet holder in correspondence with the guide hole, and is detachably assembled with the first body so that the probe card and the wafer are electrically connected; a weight ring provided with a magnet chuck that is inserted into the guide hole and is fixed to the magnet holder by magnetic force, and assembled with the second body at a top of the first body; and a clamping member configured to clamp or unclamp the first body and the second body to fix and attach/detach the first body and the second body. According to the present disclosure, by modularizing a wafer and a probe card into one piece, the precise self-position of the probe card and the wafer can be maintained during the cartridge module transfer process.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

The specific structural and functional descriptions presented in the embodiments of the present disclosure are merely illustrative for the purpose of explaining the embodiments according to the concept of the present disclosure, and the embodiments according to the concept of the present disclosure may be implemented in various forms. In addition, the present disclosure should not be construed as being limited to the embodiments described herein, but should be understood to include all changes, equivalents, and substitutes included in the spirit and technical scope of the present disclosure.

Hereinafter, the present disclosure will be described in detail with reference to the accompanying drawings.

Figure 1:
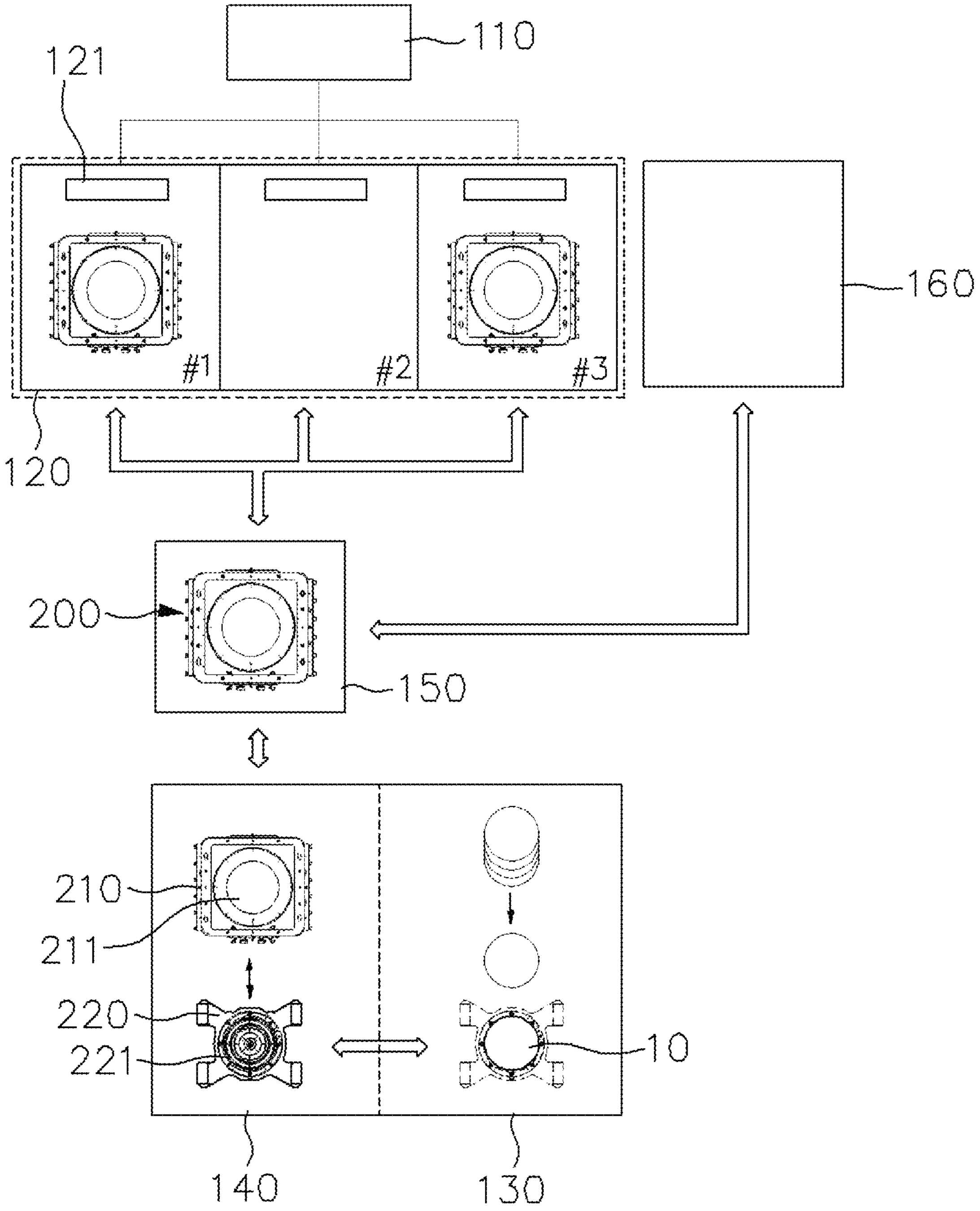
FIG. 1 is a planar arrangement view of a multi wafer burn-in test device according an embodiment of the present disclosure.
Figure 2:
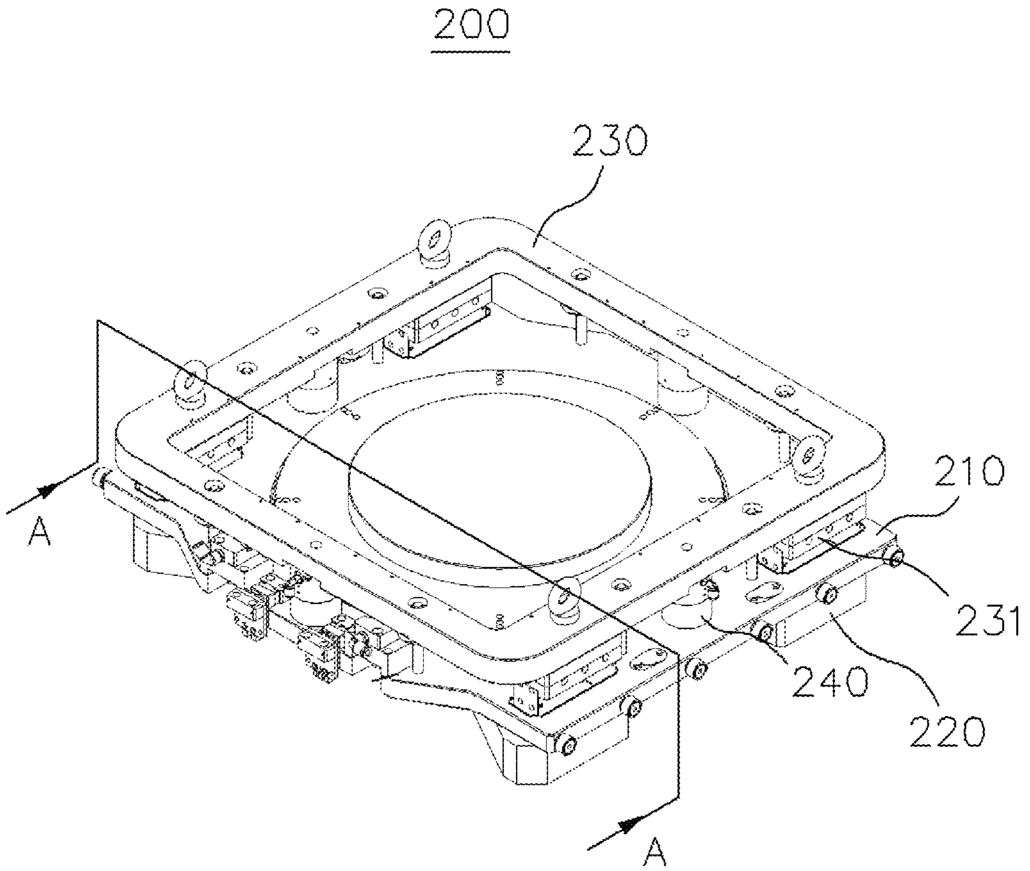
FIG. 2 is a perspective view of a cartridge module according an embodiment of the present disclosure.
Figure 3:
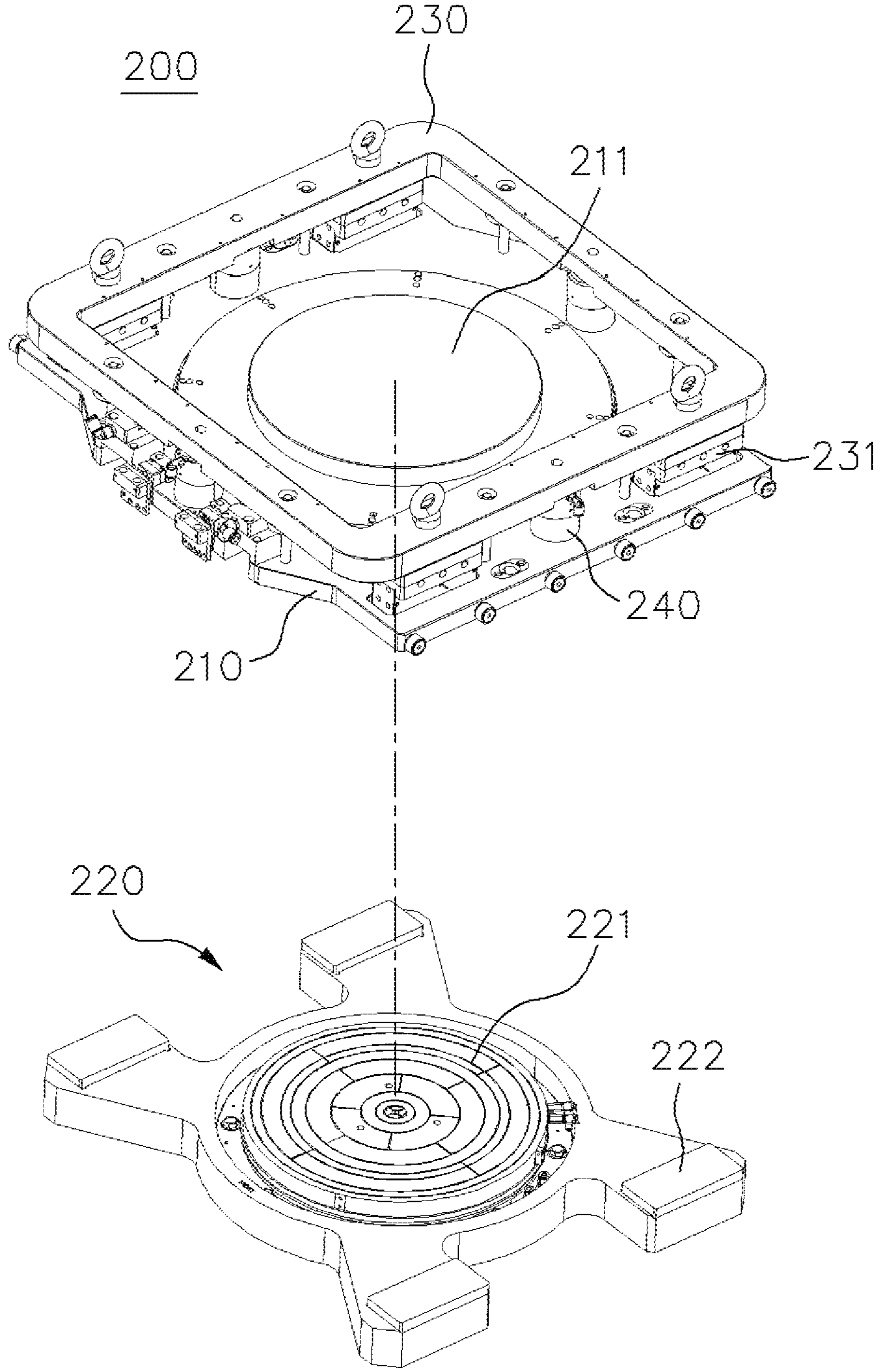
FIG. 3 is a perspective view showing the attachment/detachment state of the cartridge module according an embodiment of the present disclosure.

FIG. 1 is a planar arrangement view of a multi wafer burn-in test device according an embodiment of the present disclosure, FIG. 2 is a perspective view of a cartridge module according an embodiment of the present disclosure, and FIG. 3 is a perspective view showing the attachment/detachment state of the cartridge module according an embodiment of the present disclosure.

Referring to FIGS. 1 to 3, a multi wafer burn-in test device according an embodiment of the present disclosure includes a tester 110, a chamber 120, a wafer loading unit 130, an aligner 140, a transfer unit 150, and a cartridge module 200.

The cartridge module 200 includes a first body 210 provided with a probe card 211, and a second body 220 provided with a wafer chuck 221 and is detachably assembled with the first body 210. In addition, a clamping member is provided between the first body 210 and the second body 220, and by clamping/unclamping of the clamping member, the first body 210 and the second body 220 are clamped or unclamped and fixed to or detached from each other. In the embodiment, the clamping member may be provided by a clamping mechanism in which the clamping action is achieved by a pneumatic signal together with magnetic force. In the cartridge module 200, the first body 210 and the second body 220 are mechanically assembled to be detachable, and the clamping member enables precise self-positioning between a probe card and a wafer to be maintained, allowing multiple wafers to be inspected at once. Specific embodiments of the cartridge module are described again in the related drawings.

The chamber 120 is a multi chamber consisting of at least two or more chambers, provides a testing space for a wafer 10, and may be equipped with auxiliary facilities to create conditions such as inspection temperature. Each chamber 120 is provided with a test head 121 that is electrically connected to the tester 110, and the test head 121 is coupled to the probe card 211 of the cartridge module 200 to test the wafer 10 loaded on the cartridge module 200. The tester 110 generates a test signal, and the generated test signal is transmitted to the wafer 10 through the test head 121 and the probe card 211.

The wafer loading unit 130 is where the wafer 10 to be inspected is placed. In the wafer loading unit 130, the loading operation of the wafer 10 into the cartridge module 200 is performed. To be specific, the wafer 10 to be inspected is loaded into the second body 220 separated from the cartridge module 200.

The aligner 140 is where the cartridge module 200 is located. First, the first body 210 and the second body 220 are unclamped and detached from each other, and the second body 220 is delivered to the wafer loading unit 130. The second body 220 delivered to the wafer loading unit 130 loads the wafer 10, which is an inspection target, onto the wafer chuck 221, and the second body 220 loaded with the wafer 10 is returned to the aligner 140. The second body 220 returned to the aligner 140 is assembled with the first body 210 in a state in which the wafer 10 is seated, the first body 210 and the second body 220 are assembled by clamping of the clamping member, and the assembled cartridge module 200 is delivered to the chamber 120 by the transfer unit 150 and tested. Meanwhile, although not shown, a loader into which inspected wafers are placed may be further included.

Meanwhile, although in this embodiment, the wafer loading process of the cartridge module 200 was described by dividing the process into the wafer loading unit 130 process and the aligner 140 process, the two processes may be one continuous process rather than separate processes, and to perform the process, auxiliary equipment may be included such as known a robot arm for attaching or detaching the first body 210 and the second body 220 of the cartridge module 200, an aligner, a vision inspection device or a transport device, etc.

Preferably, the cartridge module 200 is provided with a utility supply part to supply a drive source (power/air) for clamping/unclamping operation, and the cartridge module 200 seated within the wafer loading unit 130 and the aligner 140 may be supplied with a drive source from the outside through the utility supply part to perform clamping/unclamping operations.

Preferably, a cartridge module rack 160 capable of accommodating a plurality of cartridge modules 200 is further included. The cartridge module rack 160 may store a probe card or a cartridge module that needs to be replaced, and store spare cartridge modules such as new (repaired) probe cards or cartridge modules for replacement.

Hereinafter, each of the above-described configurations will be described in detail with reference to the related drawings.

Figure 4:
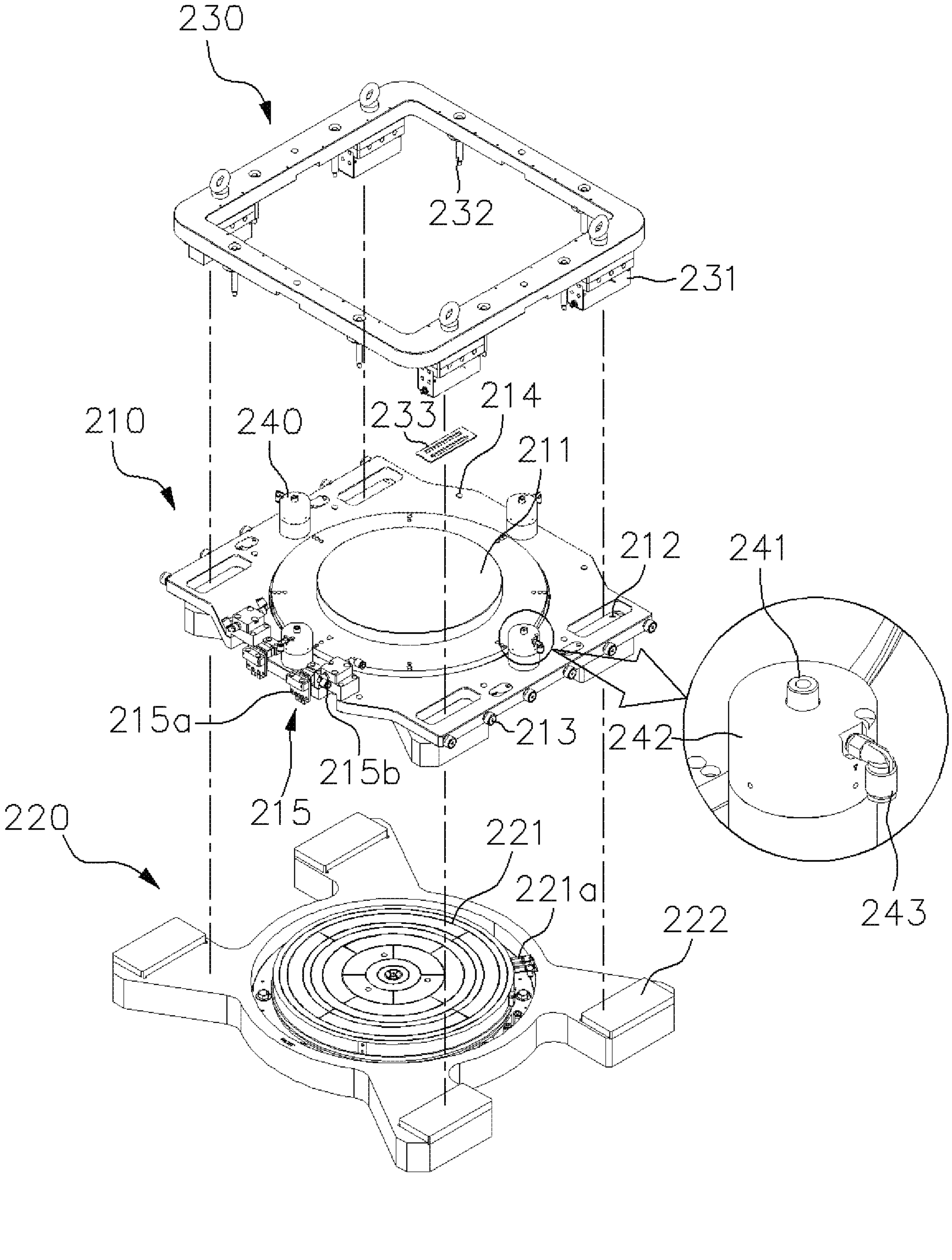
FIG. 4 is a exploded perspective view of the cartridge module according an embodiment of the present disclosure.
Figure 5:
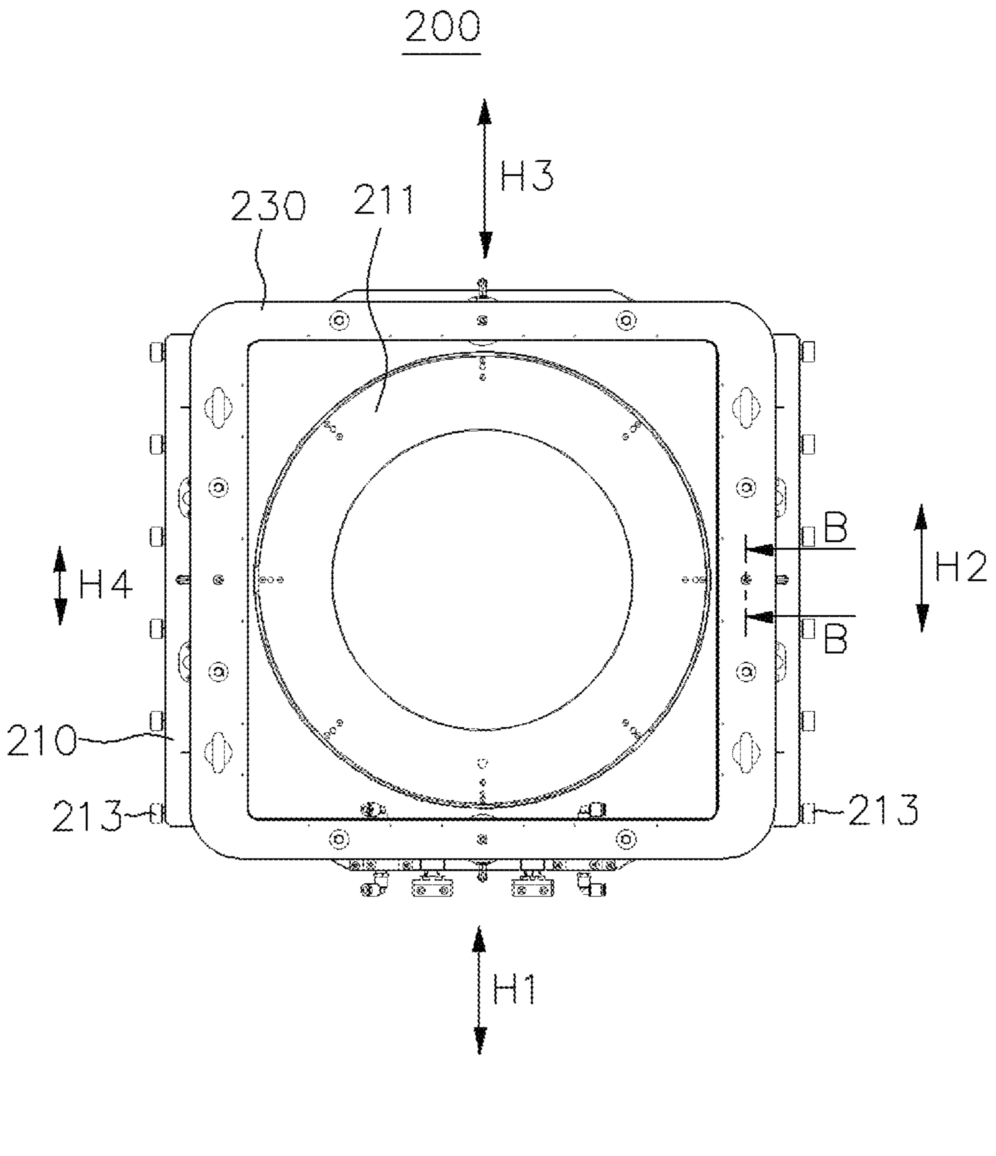
FIG. 5 is a plan view of the cartridge module according an embodiment of the present disclosure.
Figure 6A:
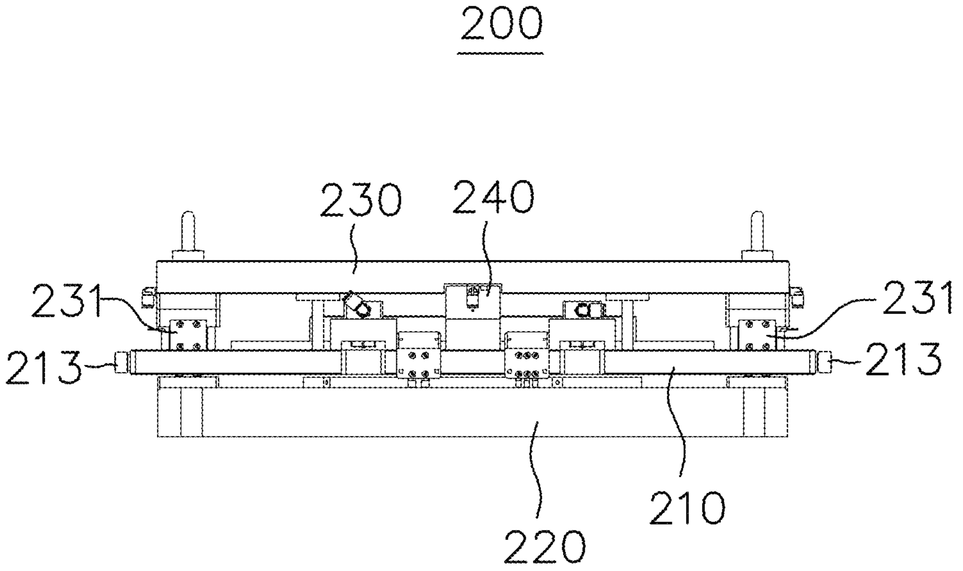
FIGS. 6A and 6B are front and side views of the cartridge module according an embodiment of the present disclosure.
Figure 6B:
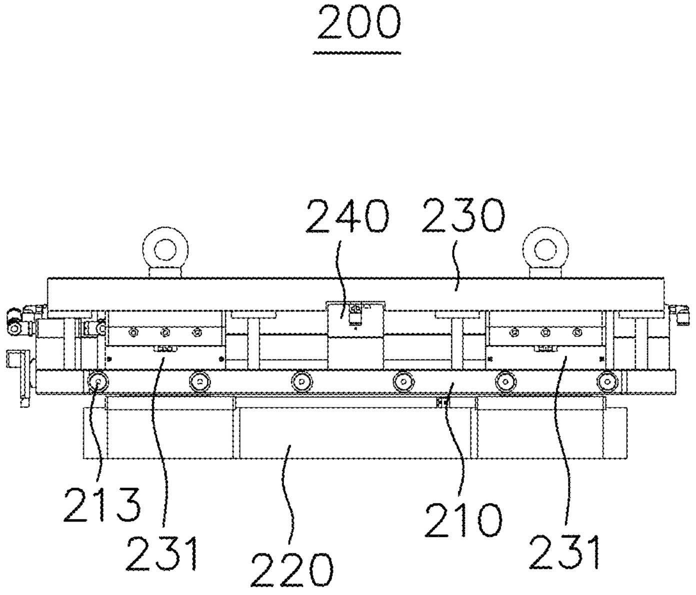
Figure 7:
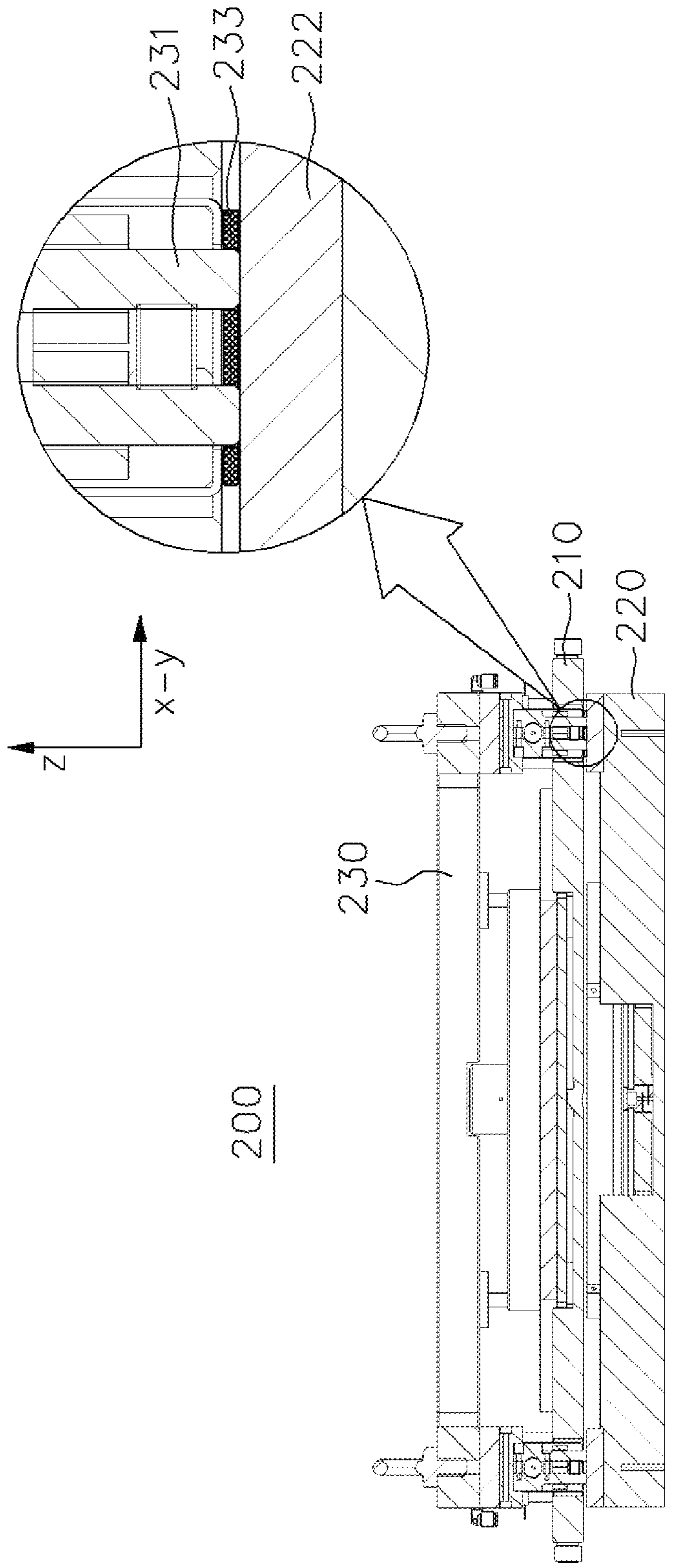
FIG. 7 is a cross-sectional view taken along line A-A in FIG. 2.

FIG. 4 is a exploded perspective view of the cartridge module according an embodiment of the present disclosure, FIG. 5 is a plan view of the cartridge module according an embodiment of the present disclosure, FIGS. 6A and 6B are front and side views of the cartridge module according an embodiment of the present disclosure, and FIG. 7 is a cross-sectional view taken along line A-A in FIG. 2.

Referring to FIGS. 4 to 7, the cartridge module 200 according to an embodiment includes the first body 210, the second body 220, a weight ring 230, and a clamp 240.

The first body 210 is provided with the probe card 211 at the center thereof, and a guide hole 212 formed vertically through the probe card 211 is provided. In the embodiment, the first body 210 is a square member with approximately four sides, and a guide hole 212 is shown to be placed at each of the four corners of the first body 210, but the shape of the first body and the number and position of the guide holes may be modified in various ways. Preferably, the first body 210 is formed with at least two guide holes 212.

The first body 210 may be provided with a plurality of freely rotatable rollers 213 at opposite ends thereof for transport. The roller 213 may be provided by a cam follower with a low coefficient of friction and excellent rotation performance, but is not limited thereto.

The first body 210 further includes a utility supply part 215 for receiving a drive source from the outside for the clamping/unclamping operation of the cartridge module 200, and in this embodiment, the utility supply part 215 is shown to have a brush 215*a* to which power is supplied and an auto coupler 215*a* to which compressed air (clean dry air, CDA) is supplied.

The second body 220 is provided with the wafer chuck 221 in the center thereof on which the wafer is seated, and is provided with a magnet holder 222 in correspondence with the guide hole 212 of the first body 210. The magnet holder 222 may be made of a known material (for example, a ferromagnetic material) so that an attractive force acts between the magnet chuck 231 provided in the weight ring 230 and the magnet holder 222 due to magnetic force. In this embodiment, four magnet holders 222 are shown at positions corresponding to the guide holes 212. The wafer chuck 221 may be provided with an air fitting 221*a* to secure the seated wafer by vacuum suction.

The weight ring 230 has a square ring shape and is provided with a magnet chuck 231 at the bottom thereof, and the magnet chuck 231 is provided with the same number in correspondence with the magnet holder 222 of the second body 220. The magnet chuck 231 may be provided as a permanent magnet or an electromagnet, and is preferably provided as a permanent magnet.

Preferably, the magnet chuck 231 further includes a friction pad 233 that may provide friction between the contact surface with the magnet holder 222. As shown in FIG. 7, the magnet chuck 231 and the magnet holder 222 are fixed by magnetic force and are strongly fixed in the vertical direction (z-axis direction), while the fixation in the horizontal direction (x-y plane) may be relatively weak. The friction pad 233 is compressed between the magnet chuck 231 and the magnet holder 222 to provide horizontal frictional force, thereby maintaining a precise self-position even against horizontal external force during the movement of the cartridge module 200. The friction pad 233 may be made of a material with a high coefficient of friction, for example, a silicon pad, but is not limited thereto.

Preferably, a plurality of guide pins 232 may be provided at the lower part of the weight ring 230, and a hole 214 is formed on the upper surface of the first body 210 in correspondence with each guide pin 232, so that during an assembly process of the weight ring 230 and the first body 210, as each guide pin 232 is inserted into the hole 214, the position of the weight ring 230 and the first body 210 for assembly may be aligned. Meanwhile, in this embodiment, although the guide pin 232 is shown as being provided on the weight ring 230, a plurality of guide pins 232 may be provided in the first body while a plurality of holes are formed in the weight ring in correspondence with each guide pin, and a guide member may further be provided to guide the assembly position of the first body 210 and the weight ring 230.

The clamp 240 is provided between the first body 210 and the weight ring 230 to maintain the gap between the first body 210 and the weight ring 230. Preferably, a plurality of clamps 140 are provided between the first body 210 and the weight ring 230.

The clamp 240 includes: a shaft whose upper end is fixed to the lower part of the weight ring 230; and a pneumatic drive unit that is fixed to the first body 210 and fixes the shaft by a pneumatic signal. Reference numeral 243 is an air fitting for supplying pneumatic pressure.

Figure 8:
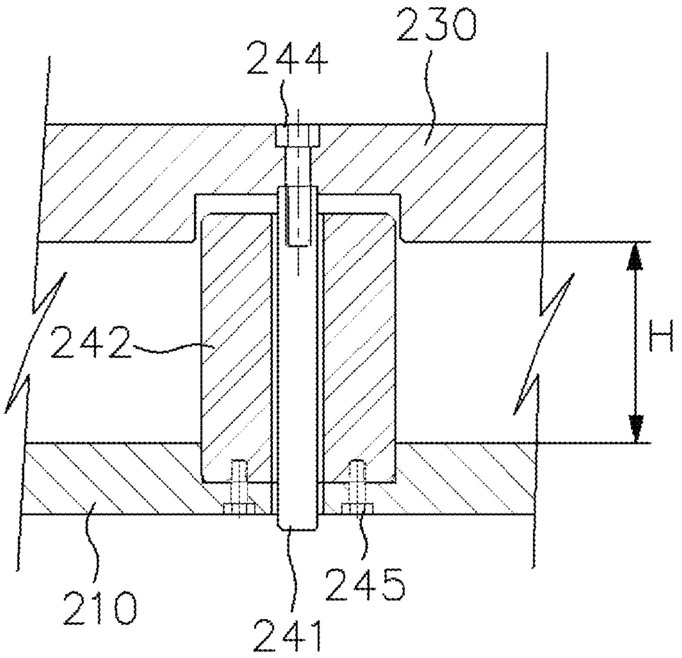
FIG. 8 is a cross-sectional view taken along line B-B in FIG. 5.

FIG. 8 is a cross-sectional view taken along line B-B in FIG. 5. To facilitate understanding, only the first body, the weight ring and the clamp are shown, and the sizes and proportions of the components are exaggerated.

Referring to FIG. 8, the clamp 240 includes the shaft 241 whose upper end is fixed by the weight ring 230 and a first bolt 244, and the pneumatic drive unit 242 whose lower end is fixed by the first body 210 and a second bolt 245 to secure the shaft 241. Depending on the pneumatic signal applied to the pneumatic drive unit 242, the shaft 241 moves up and down within the pneumatic drive unit 242 or the position (height) of the shaft 241 is fixed.

Preferably, the pneumatic drive unit 242 is a clamping mechanism driven by a normally closed (NC)-type pneumatic signal, the shaft 241 may move up and down in the pneumatic drive unit 242 while pneumatic pressure is applied to the pneumatic drive unit 242. On the other hand, when the pneumatic pressure is not applied to the pneumatic drive unit 242, the shaft 241 is fixed by the pneumatic drive unit 242 and the gap between the first body 210 and the weight ring 230 is maintained.

The clamp 240 may be provided as a clamping mechanism of the RBPS series sold as a "clamping and braking element" by Zimmer, but is not limited thereto.

In the cartridge module 200 of the present disclosure configured as described above, a wafer is placed on the wafer chuck 221, the first body 210 and the weight ring 230 are stacked and assembled on the top of the second body 220, and as the magnet chuck 231 and the magnet holder 222 are fixed by magnetic force, the first body 210, the second body 220, and the weight ring 230 are fixed to each other. Meanwhile, during the assembly process of the first body 210, the second body 220, and the weight ring 230, pneumatic pressure is applied to the clamp 240, so that the shaft 241 moves up and down in the pneumatic drive unit 242. Thereafter, when the pneumatic pressure supplied to the clamp 240 is finally cut off, the gap between the first body 210 and the weight ring 230 is maintained by the clamp 240, and the positions of the wafer and the probe card may be fixed.

In this way, the probe card and the wafer may be transported with positions thereof precisely maintained by the cartridge module 200, and may be transferred to the chamber for inspection.

In FIG. 5, gap (H1-H4) at each position between the first body 210 and the weight ring 230 fixed by four clamps is shown by arrows as an example. To facilitate understanding, the gap (H1-H4) at each position is exaggerated, and according to the present disclosure, by employing a magnetic chuck and a clamp utilizing a pneumatic signal, maintaining self-position is possible within a precise range of less than 10 μm not only in the horizontal state but also in the tilted state.

Meanwhile, in the embodiment of the present disclosure, although the explanation was given as an example of a probe card holder with 4 magnet chucks and 4 clamps, depending on the size of a wafer, the arrangement and number of magnet chucks and clamps may vary.

Figure 9A:
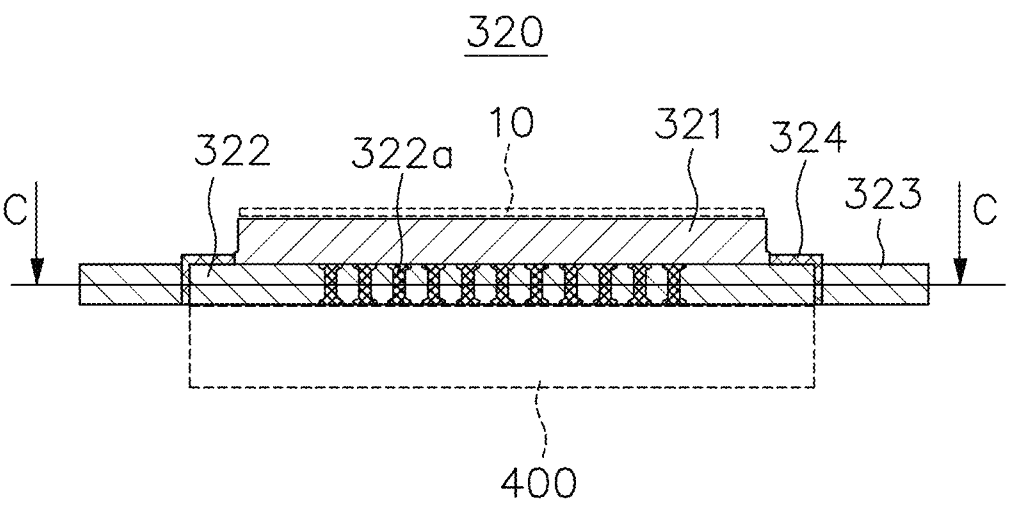
FIGS. 9A and 9B are cross-sectional views showing another example of the cartridge module according an embodiment of the present disclosure, and a cross-sectional view taken along line C-C.
Figure 9B:
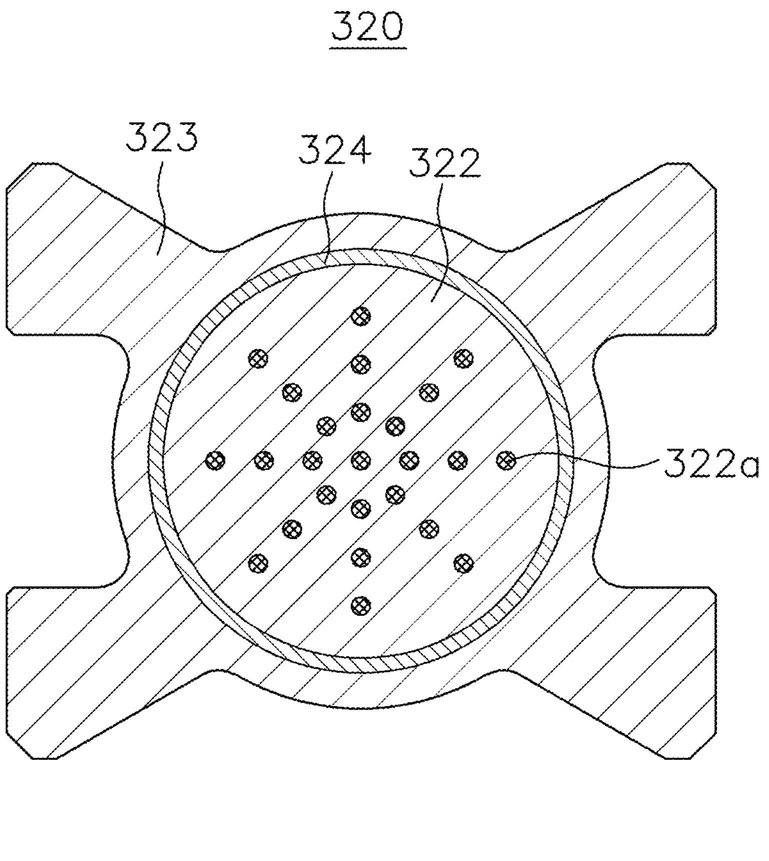

FIGS. 9A and 9B are cross-sectional views showing another embodiment of the cartridge module of the present disclosure, and a cross-sectional view taken along line C-C. Redundant description of the same configuration as the previous embodiment will be omitted and explanation will be focused on the differences.

Referring to FIGS. 9A and 9B, in this embodiment, a second body 320 includes: a wafer chuck 321 on which the wafer 10 is seated; and saddle bodies 322 and 323 that are in contact with the wafer chuck 321 and transfer heat generated by a temperature control device 400. Preferably, the saddle bodies 322 and 323 include an inner saddle body 322 and an outer saddle body 323 divided by an insulation member 324. The saddle bodies 322 and 323 provided by a heat conductor such as aluminum (Al) that transfers the heat generated by the temperature control device 400 to the wafer chuck 321. In particular, an area in direct contact with the wafer chuck 321 is partitioned with the insulation member 324 to conduct heat through the inner saddle body 322, thereby enabling more rapid temperature control of the wafer.

Preferably, the inner saddle body 322 further includes a plurality of vertically penetrating heat conductive members 322*a*. The heat conductive members 322*a* may be made of a material with a higher thermal conductivity than the saddle body 322. For example, the heat conductive member may be silver (Ag), copper (Cu), or an alloy.

As such, in this embodiment, the second body 320 is provided with the inner saddle body 322 that is in direct contact with the wafer chuck 321 by dividing the saddle bodies 322 and 323 with the insulation member 324, and the inner saddle body 322 is provided with the plurality of heat conductive members 322*a* formed through the inner saddle body, so that conductive heat for controlling the temperature of the wafer 10 may be transferred more quickly compared to a saddle body made of a single material. In addition, due to this configuration, rapid heat dissipation is achieved through the outer saddle body 323, preventing thermal energy from concentrating on the wafer 10, thereby maintaining a uniform temperature distribution of the wafer 10.

Figure 10:
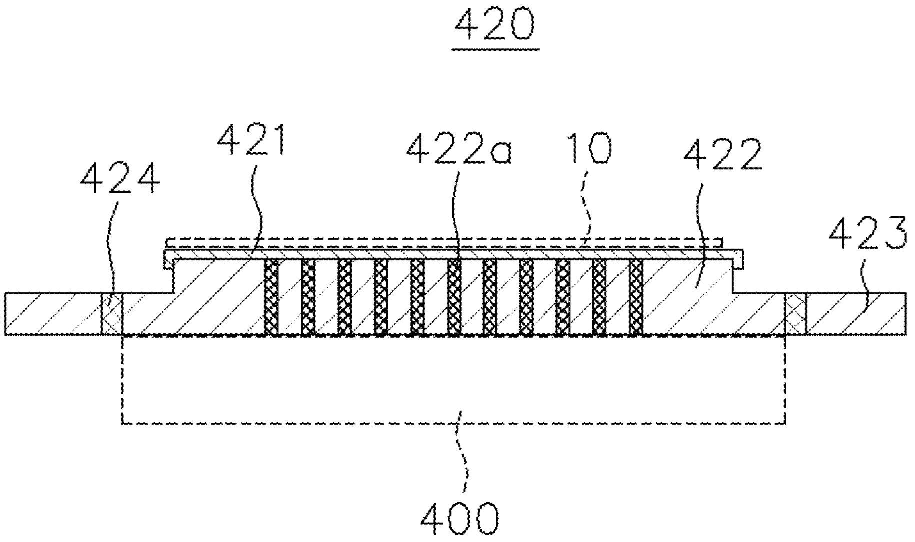
FIG. 10 is a cross-sectional view showing another modified example of a second body in the cartridge module according an embodiment of the present disclosure.

FIG. 10 is a cross-sectional view showing another modified example of a second body in the cartridge module according an embodiment of the present disclosure.

A second body 320 of this embodiment includes: a wafer chuck (thin chuck) 421 on which the wafer 10 is seated; and saddle bodies 422 and 423 that contact the wafer chuck 421 and transfer heat generated by the temperature control device 400.

In particular, the saddle bodies 422 and 423 include an inner saddle body 422 and an outer saddle body 423 divided by an insulation member 424. The inner saddle body 422, which is in direct contact with the wafer chuck 421, includes a plurality of vertically penetrating heat conductive members 422*a*. The heat conductive members 422*a* may be made of a material with a higher thermal conductivity than the saddle body 422, enabling rapid temperature control for the wafer and maintaining uniform temperature distribution as described above.

Figure 11:
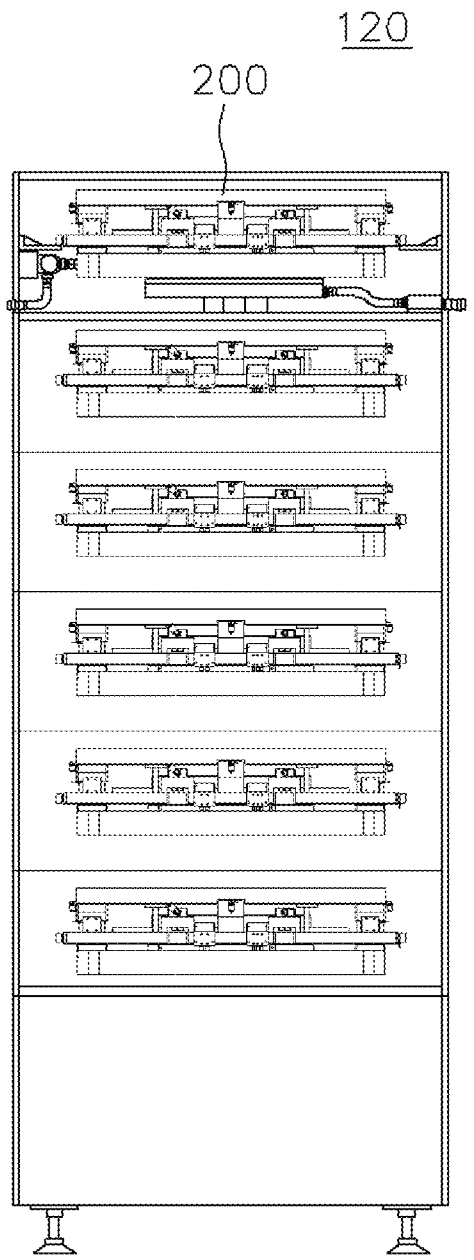
FIG. 11 is a front view of a multi chamber in the multi wafer burn-in test device according to an embodiment of the present disclosure.
Figure 12:
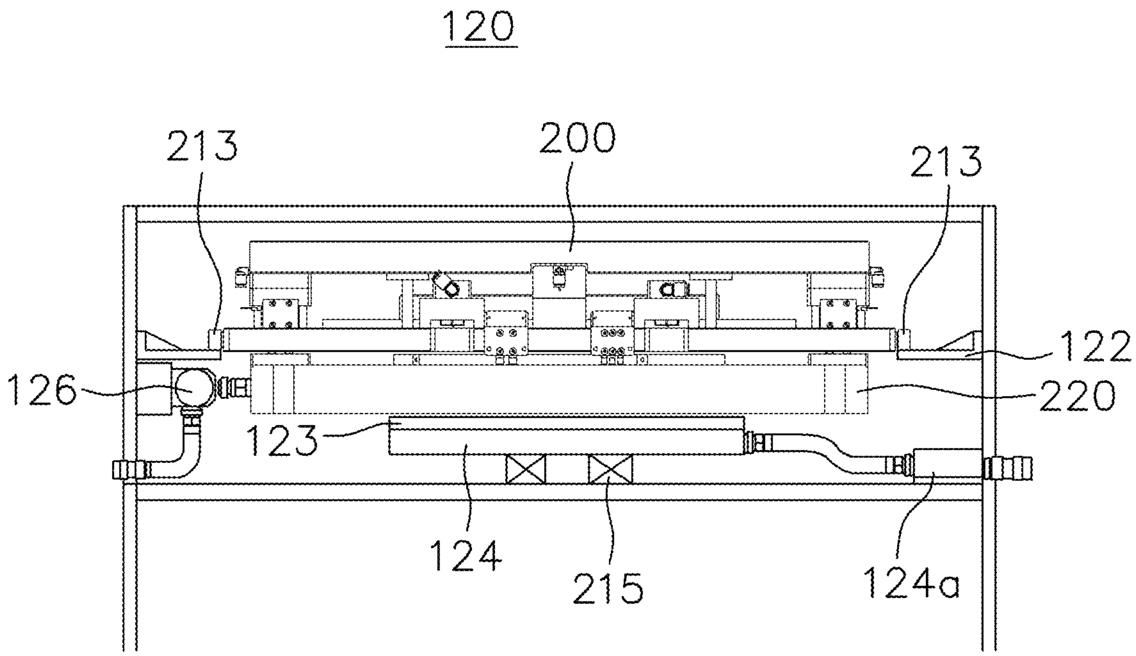
FIG. 12 is a front view showing an enlarged portion of the multi chamber in the multi wafer burn-in test device according to an embodiment of the present disclosure.

FIG. 11 is a front view of a multi chamber in the multi wafer burn-in test device according to an embodiment of the present disclosure, and FIG. 12 is a front view showing an enlarged portion of the multi chamber in the multi wafer burn-in test device according to an embodiment of the present disclosure.

Referring to FIG. 11, the chamber 120 is provided as a multi chamber consisting of at least two or more chambers, and the cartridge module 200 is seated within the chamber 120 by a transfer unit and may be automatically connected to the tester. A utility supply part of the cartridge module 200 may be connected to a drive source supply provided in the chamber to supply power and air.

FIG. 12 shows the cartridge module 200 seated in the chamber 120. The roller 213 of the cartridge module 200 is located along a guide rail 122, and a temperature control device consisting of a heating block 123 and a cooling block 124 is provided at the bottom of the second body 220. The wafer is heated or cooled to the target temperature by the heating block 123 and the cooling block 124. Reference numeral **124*a* denotes a cooling manifold for supplying refrigerant for cooling, and reference numeral 126 denotes an air manifold (CDA manifold) for supplying compressed air to the cartridge module 200. A lifting unit 215 for height adjustment may be provided at the bottom of the cooling block 124. The cartridge module 200 is seated in the chamber, the heating/cooling blocks 123 and 124 are brought into contact with the second body 220 by the lifting unit 215**, and the temperature of the wafer to be inspected is controlled by conduction.

Figure 13:
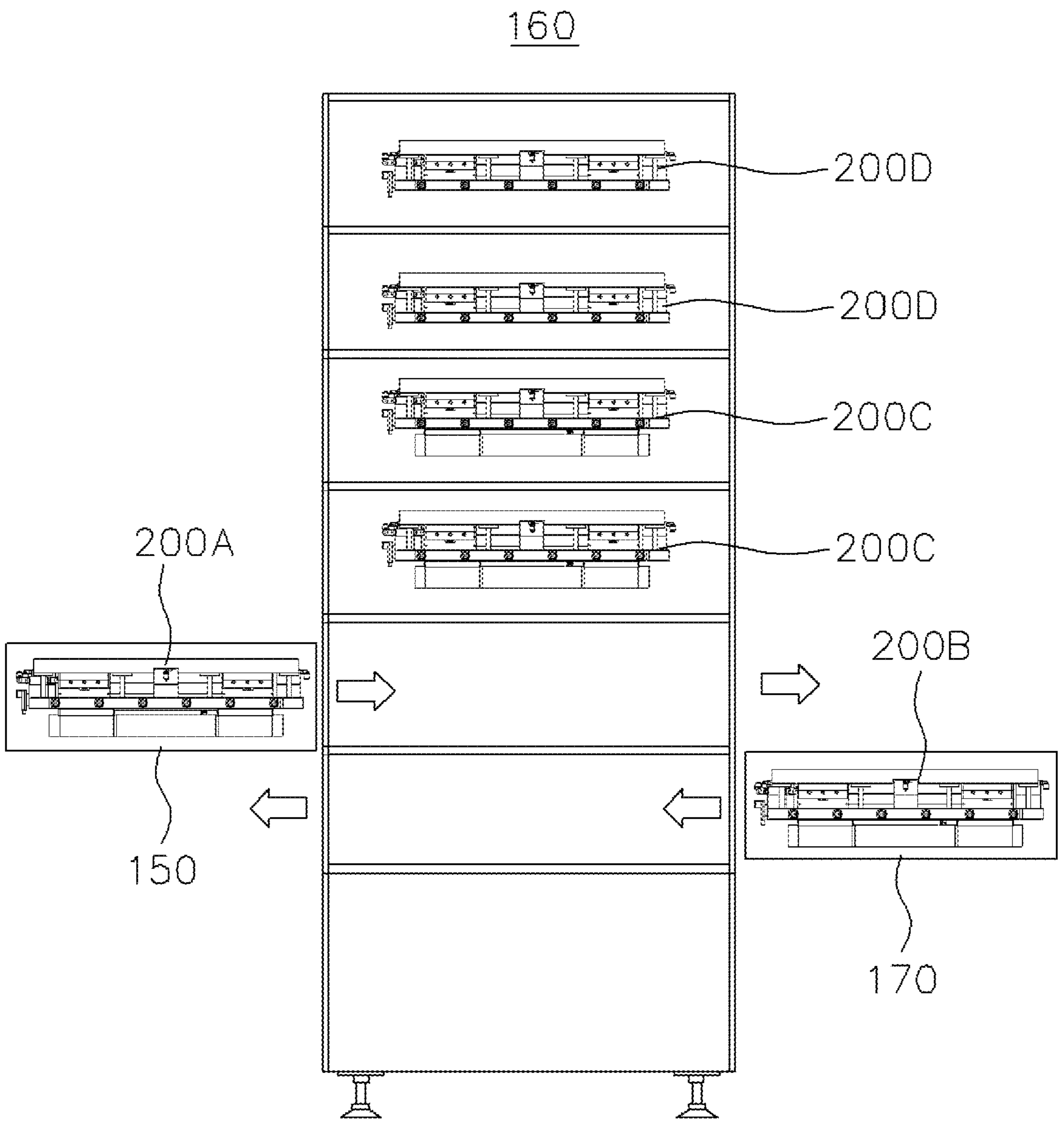
FIG. 13 is a configuration view showing a cartridge module rack in a multi wafer burn-in test device according to an embodiment of the present disclosure.

FIG. 13 is a configuration view showing a cartridge module rack in a multi wafer burn-in test device according to an embodiment of the present disclosure.

Referring to FIG. 13, the cartridge module rack 160 may accommodate at least two cartridge modules 200 and may be placed adjacent to the chamber.

The cartridge module rack 160 stores a probe card or a cartridge module that needs to be replaced, and is used to replace the probe card or cartridge module with a new (repaired) probe card or cartridge module.

For example, a broken probe card or cartridge module 200A is moved to the cartridge module rack 160 by the transfer unit 150 and waits for export to the outside for repair, and a probe card or cartridge module 200B repaired externally is stored in the cartridge module rack 160 by a transfer truck 170.

The cartridge module rack 160 may store normal probe cards and cartridge modules that may be used when replacement is needed. Reference numeral 200C shows a normal cartridge module, and reference numeral 200D shows the assembly of the first body 210 provided with a probe card and the second body 220, excluding the second body 220 provided with a wafer chuck in a normal cartridge module.

The present disclosure described above is not limited to the above-described embodiments and the attached drawings, and it will be clear to those skilled in the art that various substitutions, modifications, and changes are possible without departing from the technical spirit of the present disclosure.

What is claimed is:

1. A multi wafer burn-in test device, comprising:

at least two chambers, each of which has a test head that electrically connects a probe card and a tester to test a loaded wafer;

a cartridge module comprising a first body provided with the probe card, and a second body provided with a wafer chuck on which a wafer is seated, the first body and the second body being detachably assembled with each other;

a wafer loading unit for loading the wafer into the second body and then clamping the first body and the second body; and a transfer unit configured to transfer and deliver the cartridge module between the wafer loading unit and the chambers, wherein the cartridge module is provided with a magnet holder in the second body corresponding to a guide hole formed through the first body, and comprises:

a weight ring provided with a magnet chuck that is inserted into the guide hole and is fixed to the magnet holder by magnetic force, and assembled with the second body at a top of the first body; and a clamp provided between the first body and the weight ring to maintain a gap between the first body and the weight ring.

2. The device of claim 1, wherein each of the chambers comprises:

a guide rail on which the cartridge module is located;

a temperature control device provided below the cartridge module on the guide rail to control temperature;

a lifting unit for raising and lowering the temperature control device; and a drive source supply for supplying a drive source to the cartridge module on the guide rail.

3. The device of claim 1, further comprising:

a cartridge module rack configured to accommodate at least two cartridge modules.

4. The device of claim 1, wherein the magnet chuck further comprises a friction pad provided between a contact surface with the magnet holder.

5. The device of claim 1, wherein at least two magnet chucks are provided at a lower part of the weight ring.

6. The device of claim 5, wherein at least two clamps are provided between the first body and the weight ring.

7. The device of claim 6, wherein at least one clamp is provided between the magnet chucks that are adjacent to each other.

8. The device of claim 1, wherein the clamp comprises:

a shaft with an end fixed to one of the weight ring and the first body; and a pneumatic drive unit fixed to the other one of the weight ring and the first body and fixed to the shaft by a pneumatic signal.

9. The device of claim 8, wherein the pneumatic drive unit is a normally closed type.

10. The device of claim 1, further comprising:

a guide member between the first body and the weight ring to guide an assembly position of the first body and the weight ring.

11. A cartridge module provided with a probe card for inspecting a wafer, allowing the wafer and the probe card to be modularized and transported, the cartridge module comprising:

a first body provided with a probe card and having a guide hole formed vertically therethrough;

a second body provided with a wafer chuck on which a wafer is seated, provided with a magnet holder in correspondence with the guide hole, and is detachably assembled with the first body;

a weight ring provided with a magnet chuck that is inserted into the guide hole and is fixed to the magnet holder by magnetic force, and assembled with the second body at a top of the first body; and a clamping member configured to clamp or unclamp the first body and the second body to fix and attach/detach the first body and the second body.

12. The cartridge module of claim 11, wherein the magnet chuck further comprises a friction pad provided between a contact surface with the magnet holder.

13. The cartridge module of claim 11, wherein the clamp comprises:

a shaft with an end fixed to one of the weight ring and the first body; and a pneumatic drive unit fixed to the other one of the weight ring and the first body and fixed to the shaft by a pneumatic signal.

14. The cartridge module of claim 13, wherein the pneumatic drive unit is a normally closed type.

15. The cartridge module of claim 11, wherein the second body comprises a saddle body as a heat conductor in contact with the wafer chuck, wherein the saddle body comprises:

an inner saddle body that is partitioned by an insulation member and is in direct contact with the wafer chuck; and an outer saddle body forming a periphery of the inner saddle body.

16. The cartridge module of claim 15, wherein the inner saddle body further comprises a plurality of vertically penetrating heat conductive members with greater thermal conductivity than the saddle body.

* * * * *